US009670103B1

(12) United States Patent
Rabbani et al.

(10) Patent No.: US 9,670,103 B1
(45) Date of Patent: Jun. 6, 2017

(54) REACTOR AND METHOD FOR SYNTHESIZING METAL OXIDE IMPREGNATED CARBON NANOTUBES

(71) Applicant: KING FAHD UNIVERSITY OF PETROLEUM AND MINERALS, Dhahran (SA)

(72) Inventors: Fahad Ali Rabbani, Lahore (PK); Zuhair Omar Malaibari, Dhahran (SA); Muataz Ali Atieh, Qatar (QA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 15/077,600

(22) Filed: Mar. 22, 2016

(51) Int. Cl.
C04B 41/45 (2006.01)
C04B 41/85 (2006.01)
(Continued)

(52) U.S. Cl.
CPC .......... C04B 41/4531 (2013.01); C04B 41/85 (2013.01); C23C 16/01 (2013.01);
(Continued)

(58) Field of Classification Search
CPC ..... C04B 41/4531; C04B 41/85; C23C 16/01; C23C 16/26; C23C 16/403; C23C 16/4486; C23C 16/45563; C01B 31/022; C01B 31/0226; C01B 31/0233; C01B 31/024; C01B 31/0246; C01B 31/0253;
(Continued)

(56) References Cited

U.S. PATENT DOCUMENTS 4,837,190 A   6/1989   Summers, III et al.
5,160,544 A   11/1992  Garg et al.
(Continued)

FOREIGN PATENT DOCUMENTS

WO   2014/202740 A1   12/2014

OTHER PUBLICATIONS

Krumdieck, Kinetic Model of Low Pressure Film Deposition From Single Precursor Vapor in a Well-Mixed Cold-Wall Reactor, Acta mater 2001; 49: 583-588.*
(Continued)

*Primary Examiner* — Daniel C McCracken
(74) *Attorney, Agent, or Firm* — Oblon, McClelland, Maier & Neustadt, L.L.P.

(57) ABSTRACT

A vertical chemical vapor deposition (CVD) reactor and a method for synthesizing metal oxide impregnated carbon nanotubes. The CVD reactor includes a preheating zone portion and a reaction zone portion, and preferably an additional cooling zone portion and a product collector. The method includes (a) subjecting a liquid reactant solution comprising an organic solvent, a metallocene, and a metal alkoxide to atomization in the presence of a gas flow comprising a carrier gas and a support gas to form an atomized mixture, and (b) heating the atomized mixture to a temperature of 200° C.-1400° C., wherein the heating forms a metal oxide and at least one carbon source compound, wherein the metallocene catalyzes the formation of carbon nanotubes from the at least one carbon source compound and the metal oxide is incorporated into or on a surface of the carbon nanotubes to form the metal oxide impregnated carbon nanotubes.

8 Claims, 11 Drawing Sheets

(51) Int. Cl.
*C23C 16/26* (2006.01)
*C23C 16/448* (2006.01)
*C23C 16/01* (2006.01)
*C23C 16/40* (2006.01)
*C23C 16/455* (2006.01)

(52) U.S. Cl.
CPC ............ *C23C 16/26* (2013.01); *C23C 16/403* (2013.01); *C23C 16/4486* (2013.01); *C23C 16/45563* (2013.01)

(58) Field of Classification Search
CPC .............. C01B 31/026; C01B 31/0266; C01B 31/0273; C01B 31/028; C01B 31/0286; C01B 31/0293; C01B 2202/00; C01B 2202/02; C01B 2202/04; C01B 2202/06; C01B 2202/08; C01B 2202/10; C01B 2202/20; C01B 2202/22; C01B 2202/24; C01B 2202/26; C01B 2202/28; C01B 2202/36; C01B 2202/3001; B82Y 5/00; B82Y 10/00; B82Y 15/00; B82Y 20/00; B82Y 25/00; B82Y 30/00; B82Y 35/00; B82Y 40/00; B82Y 99/00; D01F 9/10; D01F 9/127; D01F 9/1271; D01F 9/1272; D01F 9/1273; D01F 9/1274; D01F 9/1275
USPC ........ 423/447.1–447.3, 445 B; 977/742–754, 977/842–848
See application file for complete search history.

(56) References Cited

U.S. PATENT DOCUMENTS 5,451,260 A * 9/1995 Versteeg ............ C23C 16/4486
118/725
8,916,057 B2 12/2014 Hong et al.
2005/0287064 A1* 12/2005 Mayne .................. B82Y 30/00
423/445 B

OTHER PUBLICATIONS

Vivekchand, et al., Carbon nanotubes by nebulized spray pyrolysis, Chemical Physics Letters 2004; 386: 313-318.*
Definition of "enclosed," accessed online at: https://www.merriam-webster.com/dictionary/enclose on Mar. 28, 2017.*
Definition of "chamber," accessed online at: https://www.merriam-webster.com/dictionary/chamber on Mar. 28, 2017.*
Tang, J., et al., "Synthesis of Carbon Nanotube/Aluminum Composite Powders by Polymer Pyrolysis Chemical Vapor Deposition", CARBON, vol. 55, pp. 202-208, (Apr. 2013) (Abstract only).
Yah, C.S., et al., "Synthesis of Large Carbon Nanotubes from Ferrocene: The Chemical Vapour Deposition Technique", Trends in Applied Sciences Research, vol. 6, No. 11, pp. 1270-1279 (2011).
Barreiro, A., et al., "Thermal Decomposition of Ferrocene as a Method for Production of Single-Walled Carbon Nanotubes without Additional Carbon Sources", The Journal of Physical Chemistry B, vol. 110, No. 42, pp. 20973-20977 (Sep. 29, 2006) (Abstract only).

* cited by examiner

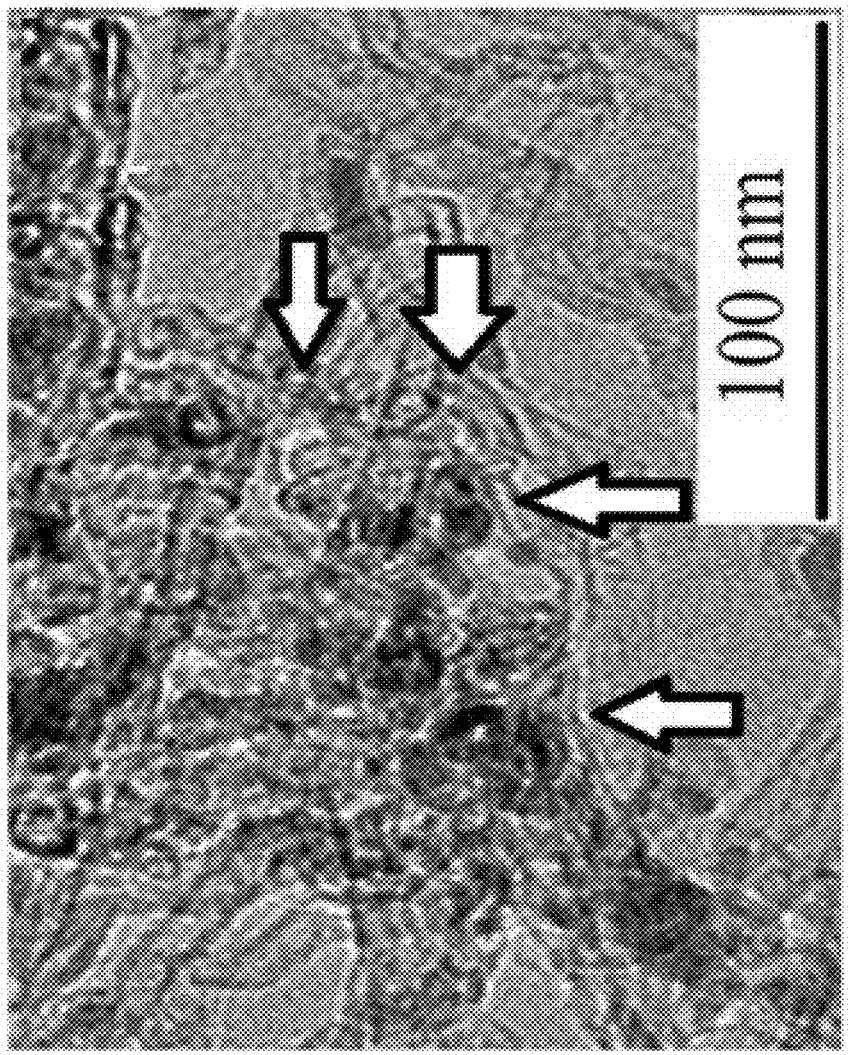

REACTOR AND METHOD FOR SYNTHESIZING METAL OXIDE IMPREGNATED CARBON NANOTUBES

BACKGROUND OF THE INVENTION

Technical Field

The present disclosure relates to devices and methods for synthesizing metal oxide impregnated carbon nanotubes. More specifically, the present disclosure relates to a chemical vapor deposition reactor and a method for synthesizing carbon nanotubes impregnated with metal oxide particles.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, is neither expressly nor impliedly admitted as prior art against the present invention.

Impregnation of carbon nanotubes with metal or metal oxide nanoparticles may be performed by conventional methods, or by special techniques such as microwave assisted impregnation (See S. C. Motshekga, S. K. Pillai, S. Sinha Ray, K. Jalama, and R. W. M. Krause, "Recent Trends in the Microwave-Assisted Synthesis of Metal Oxide Nanoparticles Supported on Carbon Nanotubes and Their Applications," *J. Nanomater.*, vol. 2012, pp. 1-15, January 2012, incorporated herein by reference in its entirety). The conventional impregnation methods, such as electro-less deposition, physical evaporation, capillary action, physisorption, solid state reaction, colloidal chemistry, and radiolysis, involve various steps ranging from a strong acid treatment to ultra-sonication. Frequently, the reduction of metal salts takes hours or days and the size and shape of the metal or metal oxide nanoparticles cannot be controlled efficiently (See R. V. Hull, L. Li, Y. Xing, and C. C. Chusuei, "Pt Nanoparticle Binding on Functionalized Multiwalled Carbon Nanotubes," *Chem. Mater.*, vol. 18, no. 7, pp. 1780-1788, April 2006. B. Xue, P. Chen, Q. Hong, J. Lin, and K. L. Tan, "Growth of Pd, Pt, Ag and Au nanoparticles on carbon nanotubes," *J. Mater. Chem.*, vol. 11, no. 9, pp. 2378-2381, January 2001. K. R. Reddy, K.-P. Lee, A. I. Gopalan, M. S. Kim, A. M. Showkat, and Y. C. Nho, "Synthesis of metal (Fe or Pd)/alloy (Fe—Pd)-nanoparticles-embedded multiwall carbon nanotube/sulfonated polyaniline composites by γ irradiation," *J. Polym. Sci. Part A Polym. Chem.*, vol. 44, no. 10, pp. 3355-3364, May 2006. C. Mao, D. J. Solis, B. D. Reiss, S. T. Kottmann, R. Y. Sweeney, A. Hayhurst, G. Georgiou, B. Iverson, and A. M. Belcher, "Virus-based toolkit for the directed synthesis of magnetic and semiconducting nanowires.," *Science*, vol. 303, no. 5655, pp. 213-7, January 2004. W.-Q. Han and A. Zettl, "Coating Single-Walled Carbon Nanotubes with Tin Oxide," *Nano Lett., vol.* 3, no. 5, pp. 681-683, May 2003, each incorporated herein by reference in their entirety).

On the other hand, microwave assisted impregnation methods are widely used nowadays for chemical reactions and nano-material production, however, the methods are difficult to implement for impregnation of carbon nanotubes with metal or metal oxide nanoparticles (See W.-X. Chen, J. Y. Lee, and Z. Liu, "Preparation of Pt and PtRu nanoparticles supported on carbon nanotubes by microwave-assisted heating polyol process," *Mater. Lett.*, vol. 58, no. 25, pp. 3166-3169, October 2004. Q.-C. Xu, J.-D. Lin, J. Li, X.-Z. Fu, Y. Liang, and D.-W. Liao, "Microwave-assisted synthesis of MgO-CNTs supported ruthenium catalysts for ammonia synthesis," *Catal. Commun.*, vol. 8, no. 12, pp. 1881-1885, December 2007. M. Nuchter, B. Ondruschka, W. Bonrath, and A. Gum, "Microwave assisted synthesis—a critical technology overview," *Green Chem.*, vol. 6, no. 3, p. 128, March 2004, each incorporated herein by reference in their entirety). The difficulty lies in the fact that in order to transform a metal salt to a desired metal or a metal oxide compound, a microwave of a specific wavelength is required.

Thus, it is an object of the present disclosure to provide a chemical vapor deposition reactor and a method for synthesizing metal oxide impregnated carbon nanotubes that is less time consuming and easier to perform as compared to the conventional and microwave assisted impregnation methods.

BRIEF SUMMARY OF THE INVENTION

The present disclosure relates to a method of synthesizing carbon nanotubes impregnated with at least one metal oxide. The method includes (a) subjecting a liquid reactant solution to atomization in the presence of at least one gas flow comprising at least one carrier gas and at least one support gas, wherein the liquid reactant solution comprises at least one organic solvent, at least one metallocene, and at least one metal alkoxide, to form an atomized mixture comprising droplets of the liquid reactant solution and the at least one gas flow, and (b) heating the atomized mixture to a temperature of 200° C.-1400° C., wherein the heating forms at least one metal oxide and at least one carbon source compound, wherein the at least one metallocene catalyzes the formation of carbon nanotubes from the at least one carbon source compound and the at least one metal oxide is incorporated into or on a surface of the carbon nanotubes to form the carbon nanotubes impregnated with the at least one metal oxide.

In one or more embodiments, the method further comprises collecting the carbon nanotubes impregnated with the at least one metal oxide.

In one or more embodiments, the at least one carrier gas is at least one selected from the group consisting of He, $N_2$, and Ar.

In one or more embodiments, the at least one support gas is selected from the group consisting of $CO_2$, $H_2O$, $H_2$ and $NH_3$.

In one or more embodiments, the at least one organic solvent is selected from the group consisting of 2-methoxy ethanol, 2-ethoxy ethanol, 2-methoxy propanol, 2-ethoxy propanol, 2-propoxy propanol, 2-butoxy propanol, 2-butoxy butanol, cyclohexane, heptane, octane, benzene, toluene, ethyl benzene, xylene, cumene, and styrene.

In one or more embodiments, the at least one metallocene is selected from the group consisting of a metallocene of Ni, a metallocene of Co, a metallocene of Fe, a metallocene of Cr, a metallocene of Mo, a metallocene of Rh, a metallocene of Ti, a metallocene of W, a metallocene of V, and a metallocene of Zr.

In one or more embodiments, the at least one metal alkoxide is one or more metal alkoxy alkoxides.

In one or more embodiments, the at least one metal alkoxide is selected from the group consisting of an aluminum alkoxide, a titanium alkoxide, a magnesium alkoxide, a calcium alkoxide, a strontium alkoxide, a barium alkoxide, a scandium alkoxide, a yttrium alkoxide, a zirconium alkoxide, a lanthanum alkoxide, a vanadium alkoxide, and a silicon alkoxide.

In one or more embodiments, the at least one metal alkoxide is aluminum isopropoxide which is heated to form aluminum oxide and the carbon nanotubes formed are multi-walled carbon nanotubes, and the synthesized multi-walled carbon nanotubes impregnated with the aluminum oxide have a BET surface area of 450-2000 m$^2$/g.

In one or more embodiments, the at least one metal alkoxide is aluminum isopropoxide which is heated to form aluminum oxide, and 1-99 wt % of the aluminum oxide incorporated into or on the surface of the carbon nanotubes is in corundum phase.

Additionally, the present disclosure relates to a vertical chemical vapor deposition reactor. The vertical chemical vapor deposition reactor includes a preheating zone portion comprising a first enclosed chamber and having a top, a bottom, and sides with a wall defining the first enclosed chamber; a first inlet located at the top of the preheating zone portion for introducing carrier, support, and/or reactant gases and at least one liquid reactant solution into the first enclosed chamber; an ultrasonic atomizing nozzle operatively connected to the first inlet for releasing the carrier, support, and/or reactant gases and the at least one liquid reactant solution inside the first enclosed chamber; a reaction zone portion comprising a second enclosed chamber and having a top connected to and in fluid communication with the bottom of the preheating zone portion, a bottom, and sides with a wall defining the second enclosed chamber; a heater interposed between the top and the bottom of the reaction zone portion for heating the carrier, support, and/or reactant gases and the at least one liquid reactant solution; and an outlet at the bottom of the reaction zone portion for extracting at least one reaction waste product from the second enclosed chamber.

In one or more embodiments, the wall defining the second enclosed chamber of the reaction zone portion comprises at least one material that is substantially gas-impermeable and resistant to a temperature of at least 200° C.

In one or more embodiments, the at least one material that is substantially gas-impermeable and resistant to a temperature of at least 200° C. is selected from the group consisting of quartz and stainless steel.

In one or more embodiments, the first inlet for introducing carrier, support, and/or reactant gases and at least one liquid reactant solution into the first enclosed chamber of the preheating zone portion is operatively connected to a pump that is connected to a liquid reactant solution container or mixer.

In one or more embodiments, the vertical distance between the top and the bottom of the preheating zone portion and the ultrasonic atomizing nozzle are configured to enable droplets of the at least one liquid reactant solution sprayed from the ultrasonic atomizing nozzle to have a substantially uniform velocity prior to entering the reaction zone portion.

In one or more embodiments, the vertical chemical vapor deposition reactor further comprises a product collector connected to the bottom of the reaction zone portion.

In one or more embodiments, the top of the preheating zone portion further comprises a second inlet through which an evacuation gas can be introduced into the first enclosed chamber to displace and remove the at least one reaction waste product.

In one or more embodiments, the vertical chemical vapor deposition reactor includes a preheating zone portion comprising a first enclosed chamber and having a top, a bottom, and sides with a wall defining the first enclosed chamber; a first inlet located at the top of the preheating zone portion for introducing carrier, support, and/or reactant gases and at least one liquid reactant solution into the first enclosed chamber; an ultrasonic atomizing nozzle operatively connected to the first inlet for releasing the carrier, support, and/or reactant gases and the at least one liquid reactant solution inside the first enclosed chamber; a reaction zone portion comprising a second enclosed chamber and having a top connected to and in fluid communication with the bottom of the preheating zone portion, a bottom, and sides with a wall defining the second enclosed chamber; a heater interposed between the top and the bottom of the reaction zone portion for heating the carrier, support, and/or reactant gases and the at least one liquid reactant solution; a cooling zone portion comprising a third enclosed chamber and having a top connected to and in fluid communication with the bottom of the reaction zone portion, a bottom, and sides with a wall defining the third enclosed chamber, and an outlet at the bottom of the cooling zone portion for extracting at least one reaction waste product from the third enclosed chamber.

In one or more embodiments, the bottom of the cooling zone portion is connected to a product collector.

In one or more embodiments, the first inlet for introducing carrier, support, and/or reactant gases and at least one liquid reactant solution into the first enclosed chamber of the preheating zone portion is operatively connected to a pump that is connected to a liquid reactant solution container or mixer.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 8 is a TEM image of the aluminum oxide impregnated multi-walled carbon nanotubes according to Example 2.

DETAILED DESCRIPTION OF THE EMBODIMENTS

Figure 1:
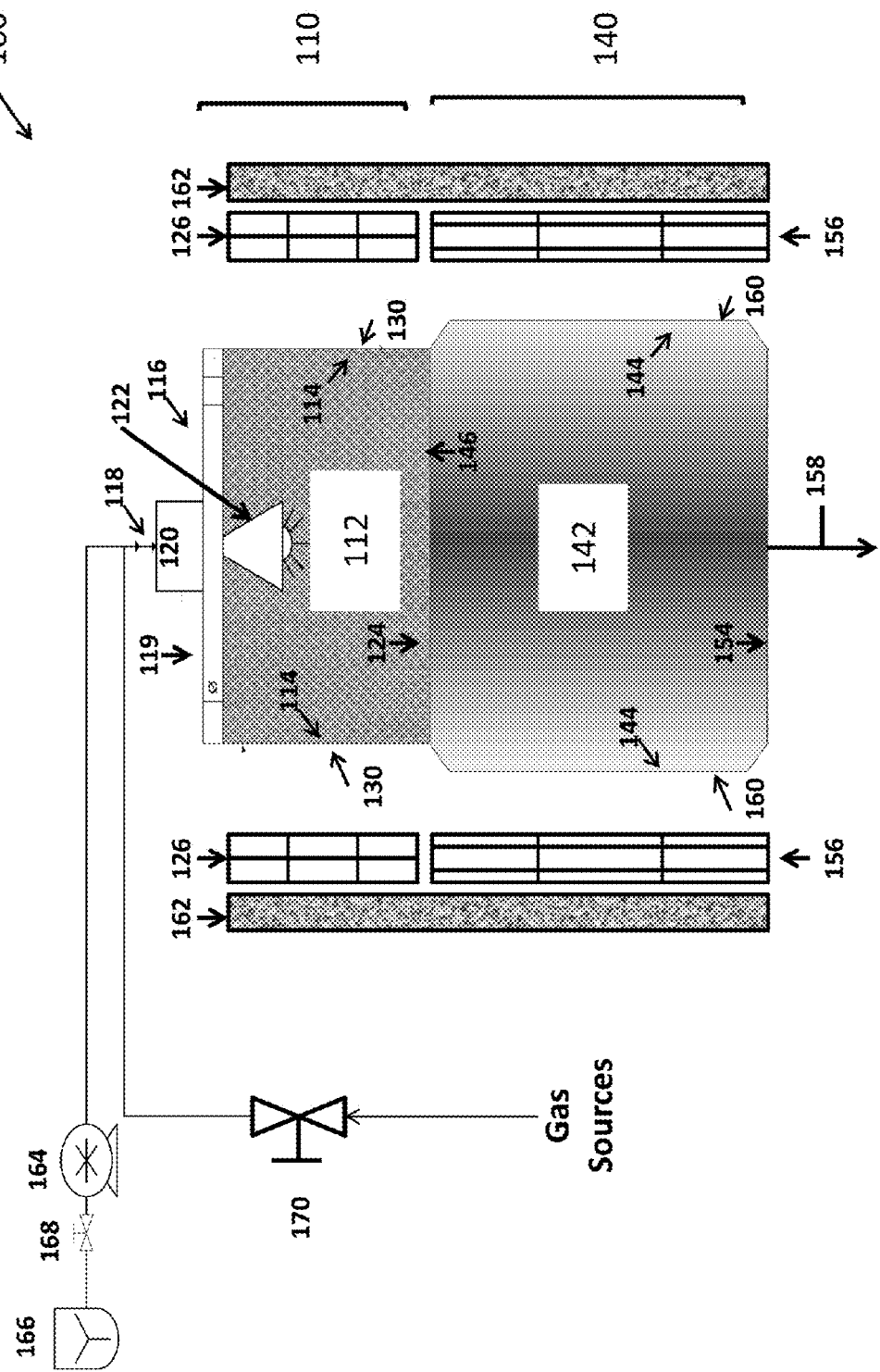
FIG. 1 illustrates, in correspondence with one embodiment of the present disclosure, an exemplary vertical chemical vapor deposition reactor 100, preferably used for synthesizing metal oxide impregnated carbon nanotubes.

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

A first aspect of the disclosure relates to a chemical vapor deposition (CVD) reactor equipped with an ultrasonic atomizing nozzle to advantageously use both gases and liquid reactant solutions as starting materials to carry out a chemical vapor deposition reaction. Referring to FIG. 1, one embodiment of the CVD reactor designated 100 is a vertical CVD reactor that includes a preheating zone portion 110 and a reaction zone portion 140.

The preheating zone portion 110 includes a first enclosed chamber 112 defined by the first enclosed chamber (inside) wall 114 that surrounds the first enclosed chamber 112 on the sides. The preheating zone portion 110 has a top 116, which may be a removable top plate and which has a first inlet 118 for introducing gases, such as a carrier gas (e.g. He, $N_2$, and Ar), a support gas (e.g. $CO_2$, $H_2O$, $H_2$, and $NH_3$), and/or a reactant gas (e.g. a carbon-containing gas to synthesize carbon nanotubes, such as methane, ethane, propane, and carbon monoxide), and one or more liquid reactant solutions for a CVD reaction into the first enclosed chamber 112. The first inlet 118 is operatively connected to an ultrasonic atomizing nozzle 120, a type of spray nozzle, with the tip 122 of the ultrasonic atomizing nozzle 120 located inside the first enclosed chamber 112 for releasing the gases and the liquid reactant solution(s) inside the first enclosed chamber 112. The bottom 124 of the preheating zone portion 110 is connected to and in fluid communication with a top 146 of the reaction zone portion 140, i.e. the gases and the liquid reactant solution(s) entering into the first enclosed chamber 112 can enter into the reaction zone portion 140 via the top 146 of the reaction zone portion 140.

The ultrasonic atomizing nozzle 120 converts electrical energy into mechanical energy in the form of ultrasonic vibrations that atomize a liquid into tiny droplets with sizes in the micron range. The ultrasonic atomizing nozzle operates at a specific resonant frequency, which is determined primarily by the length of the nozzle. The size of the droplets is governed by the resonant frequency of the ultrasonic atomizing nozzle (i.e. the higher the resonant frequency, the smaller the median droplet size) and by the surface tension and the density of the liquid being atomized. In some embodiments, the ultrasonic atomizing nozzle 120 has a resonant frequency of 10-200 kHz, 15-180 kHz, 20-150 kHz, 20-120 kHz, 20-100 kHz, 40-80 kHz, or 50-70 kHz, to produce liquid droplets with a median droplet size of about 10-140 microns, about 30-120 microns, about 50-100 microns, or about 70-90 microns. The median droplet size defines the 50% point in droplet size—that is, one-half of the number of droplets in the spray have diameters larger that this value while the other half have diameters smaller than this value.

Figure 2:
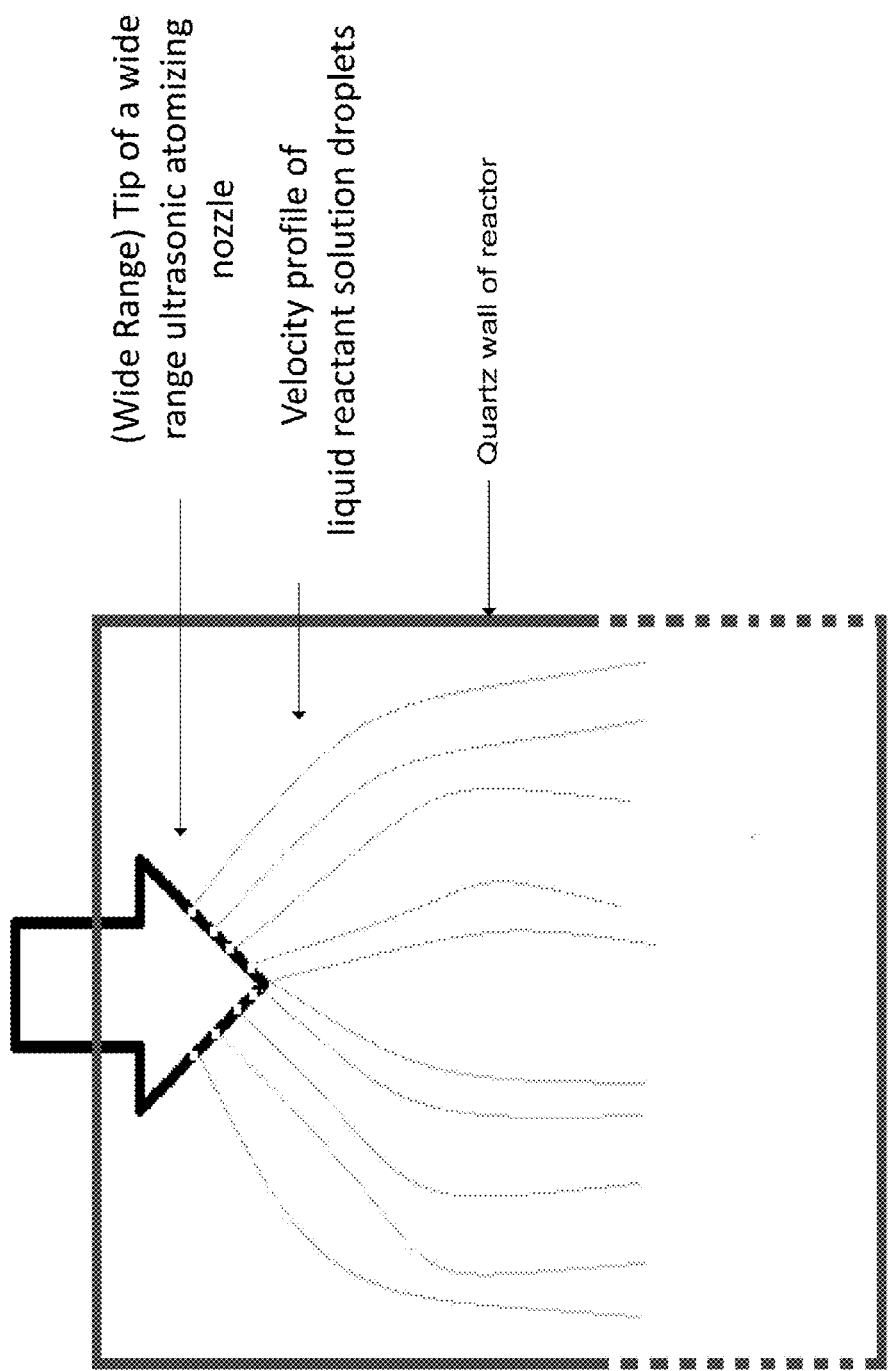
FIG. 2 is a graphical presentation showing the velocity profile of liquid reactant solution droplets sprayed from the tip of a wide range ultrasonic atomizing nozzle installed on the top of the preheating zone of a chemical vapor deposition reactor according to Example 1.

The ultrasonic atomizing nozzle 120 in the preheating zone portion 110 generates a soft, non-pressurized, low velocity spray of the liquid reactant solution(s), typically on the order of 3-5 inches per second, advantageously reducing the amount of overspray and leading to substantial material savings and a reduction in the waste discharged into the environment, since the droplets of the spray tend to settle on a surface they come into contact with, for example, the inside wall 144 of the reaction zone portion 140, to form the CVD reaction products rather than bounce off the surface. Additionally, by controlling the flow rates of the gases that also travel through the ultrasonic atomizing nozzle 120 via the first inlet 118 and by equipping the ultrasonic atomizing nozzle 120 with a specialized type of spray shaper attached to the tip 122, the spray pattern may be controlled and shaped, for example, from as small as 0.070 inches wide to as much as 1-2 feet wide. FIG. 2 illustrates an ultrasonic atomizing nozzle with a wide range tip according to the Examples of the present disclosure that produced a liquid droplet spray almost as wide as the diameter of the tube-shaped first enclosed chamber of the preheating zone portion of the CVD reactor, with the ultrasonic atomizing nozzle positioned at the center on the top plate of the preheating zone portion. The wide range tip of the ultrasonic atomizing nozzle is capable of dispersing droplets over a wide area because of an angled portion of the tip. As liquid rides up the tip, droplets are pulverized on an angle and pushed away from the nozzle. To further increase the spray area covered by the nozzle, the wide range tip can be attached to an appropriate spray shaper, e.g. a Dove Tail Spray Shaper manufactured by Sonaer Ultrasonics (Farmingdale, N.Y., USA), such that as the ultrasonic atomizing nozzle sprays the liquid, the air from the spray shaper will spread the droplets over a greater area, for example, with a spray angle of from about 20 degrees to 34 degrees and a spray diameter of 2-3 inches when the Dove Tail Spray Shaper is used. Preferably, the width of the liquid droplet spray, the initial velocity of the liquid droplets exiting the tip of the ultrasonic atomizing nozzle that has both a radial and a vertical velocity component, and the height of the preheating zone portion, i.e. the vertical distance between the top and the bottom of the preheating zone portion, are properly controlled and adjusted such that (substantially) all of the liquid droplets have a substantially uniform downward velocity prior to entering the reaction zone portion as shown in FIG. 2 to supply (substantially) all of the input liquid reactant solution to the reaction zone portion (without a loss of the input liquid reactant solution due to an undesirable contacting of the liquid reactant solution droplets with the inside wall of the first enclosed chamber of the preheating zone portion), and form a desired reaction product with homogeneous physical and chemical characteristics. In a preferred embodiment, the first enclosed chamber 112 of the preheating zone portion 110 is tube-shaped or cylindrically shaped. In some embodiments, the ultrasonic atomizing nozzle 120 has a wide range tip capable of generating a spray with a width that is at least 70%, preferably at least 80%, more preferably at least 90%, or most preferably at least 95% of the width or diameter of the first enclosed chamber 112 of the preheating zone portion 110.

The preheating zone portion 110 preferably further comprises a preheating element 126 to ensure the attainment of the desired temperature for the liquid reactant solution(s) and the gas flow in the reaction zone portion 140. The preheating element 126, which may be a gas heater or furnace, or an electrical heater or furnace, may be installed within the first enclosed chamber 112, or surrounding the outside wall 130 of the first enclosed chamber 112, or at the tubing of the first inlet 118 on the top 116 of the preheating zone portion 110. The preheating element 126 preferably operates at a lower temperature e.g. 100 to 1200° C., than the chosen CVD reaction temperature, e.g. 200-1400° C.

The reaction zone portion 140 has a second enclosed chamber 142 defined by the second enclosed chamber inside wall 144 surrounding the second enclosed chamber 142. In a preferred embodiment, the second enclosed chamber 142 of the reaction zone portion 140 is tube-shaped or cylindrically shaped. The bottom 154 of the reaction zone portion 140, which may be a removable bottom plate, has an outlet 158 for extracting the input carrier, support, and reactant gases and vaporized liquid reactant solution(s), and/or reaction waste products from the second enclosed chamber 142. The outlet 158 may be connected to a vacuum pump (not shown) to facilitate the extraction and removal of the input and waste product gases. To provide a high reaction temperature, such as 200-1400° C., 400-1200° C., 500-1000° C., 600-900° C., 750-900° C., or 850° C., in the second enclosed chamber 142 of the reaction zone portion 140, a heater 156, such as a gas heater or furnace and an electric heater or furnace, is installed between the top 146 and the bottom 154 of the reaction zone portion 140 for heating the input (carrier, support, and/or reactant) gases and the liquid reactant solution droplets to a desired temperature to generate active species for the CVD reaction. For example, a furnace may be installed adjacent, or preferably surrounding, the outside wall 160 of the second enclosed chamber 142 of the reaction zone portion 140 to provide heat, preferably substantially evenly distributed heat, to the second enclosed chamber 142 to reach a desired CVD reaction temperature within a range described above. Alternatively, one, or preferably a plurality of electrically powered heat generating filament networks may be installed, either vertically (i.e. in parallel to the gas and liquid reactant solution droplet flows) or horizontally (i.e. perpendicular to the gas and liquid reactant solution droplet flows) between the top 146 and the bottom 154 of the reaction zone portion 140 to preferably provide substantially evenly distributed heat within the second enclosed chamber 142. The filament network may be made of 0.1-3 mm, 0.2-1.5 mm, or 0.5-1 mm diameter resistively heatable metal wires that may be parallel and/or twisted to provide a large heating area. Suitable material for the metal wires of the filament network include, without limitation, tantalum, tungsten, molybdenum, rhenium, and mixtures thereof. In some embodiments, the filament network comprises a composite material having a core of material selected from the group consisting of a ceramic, graphite, carbon fiber, and carbon-carbon composite and an outer coating of a material selected from the group consisting of tantalum, tungsten, molybdenum, rhenium, and mixtures thereof. A thicker wire is preferably used in the filament network to provide a stronger structural integrity and longer use life.

The material for the inside wall 114 of the first enclosed chamber 112 of the preheating zone portion 110 is preferably strong, substantially resistant to corrosion, substantially gas-impermeable, and inert to the input gases and the liquid reactant solution(s) for a CVD reaction. The material for the inside wall 144 of the second enclosed chamber 142 of the reaction zone portion 140 is preferably substantially gas-impermeable, inert to the input gases and the liquid reactant solution(s) for a CVD reaction, and resistant to a high temperature, such as 200-1400° C., 400-1200° C., 500-1000° C., 600-900° C., and 750-900° C., or 850° C. Non-limiting examples of the suitable material for the walls of the first enclosed chamber and the second enclosed chamber include quartz and metal, such as stainless steel.

Insulation 162 is preferably provided around the preheating zone portion 110 and the reaction zone portion 140 to control the temperature and ensure a safe and economic operation of the CVD reactor. The insulation may be provided by a graphite foam or quartz wool.

In a preferred embodiment, the first inlet 118 on the top 116 of the preheating zone portion 110 for introducing the input gases and the liquid reactant solution(s) into the first enclosed chamber 112 of the preheating zone portion 110 is operatively connected to a pump 164 that is connected to a liquid reactant solution container or mixer 166 shown in FIG. 1. In some embodiments, the pump 164 is a gear pump, an injection or syringe pump, or a peristaltic pump. A valve 168 is preferably installed on the connective line between the liquid reactant solution container/mixer 166 and the pump 164 to help control the flow rate of the liquid reactant solution fed to the ultrasonic atomizing nozzle 120 via the first inlet 118 on the top 116 of the preheating zone portion 110. Since the ultrasonic atomization process does not rely on pressure, the amount of the liquid reactant solution atomized per unit time is primarily determined by the flow rate of the liquid reactant solution controlled by the pump 164 and/or the valve 168. The flow rate of the liquid reactant solution suitable for the ultrasonic atomization may vary widely, depending on the type of the ultrasonic atomizing nozzle used, particularly the size of its orifice through which the liquid reactant solution emerges onto the atomizing surface of the nozzle, the atomizing surface area, and the operating frequency, the viscosity of the liquid reactant solution, and the presence of any very long-chained polymer molecules and/or undissolved solids in the liquid reactant solution. In some embodiments, the flow rate of the liquid reactant solution is in the range of 1 ml/h to 16 L/h, 10 ml/h to 10 L/h, 50 ml/h to 5 L/h, 100 ml/h to 1 L/h, 200-800 ml/h, or 400-600 ml/h.

Likewise, a valve 170 may be preferably installed on the connective line between the input gas sources and the first inlet 118 on the top 116 of the preheating zone portion 110 to control the flow rates of the input gases also fed to the ultrasonic atomizing nozzle 120 via the first inlet 118.

Since the bottom 154 of the reaction zone 140 and the top 116 of the preheating zone portion 110 isolate the reactor, the interior of the reactor, i.e. the first enclosed chamber 112 and the second enclosed chamber 142, can be evacuated without significant inward leakage from the surrounding ambient atmosphere. In another preferred embodiment, the top 116 of the preheating zone portion 110 further comprises a second inlet 119 through which an evacuation gas can be introduced into the first enclosed chamber 112. With the evacuation gas further flowing into the second enclosed chamber 142 of the reaction zone portion 140 and exiting the CVD reactor 100 through the outlet 158 at the bottom 154 of the reaction zone portion 140, the evacuation gas displaces and removes excess input gases and vaporized liquid reactant solution(s), and gaseous reaction waste products from the CVD reactor 100. Non-limiting examples of the suitable evacuation gas include air and inert gases, such as argon, helium, and nitrogen.

Since in some embodiments a desired CVD reaction product, e.g. carbon nanotubes, deposits on the inside wall 144 of the second enclosed chamber 142 of the reaction zone portion 140, a product collector (not shown in FIG. 1) may be (detachably) connected to the bottom 154 of the reaction zone portion 140 to collect the CVD reaction product that has been separated from the inside wall 144 of the second enclosed chamber 142 by scraping or brushing, for example.

Figure 3:
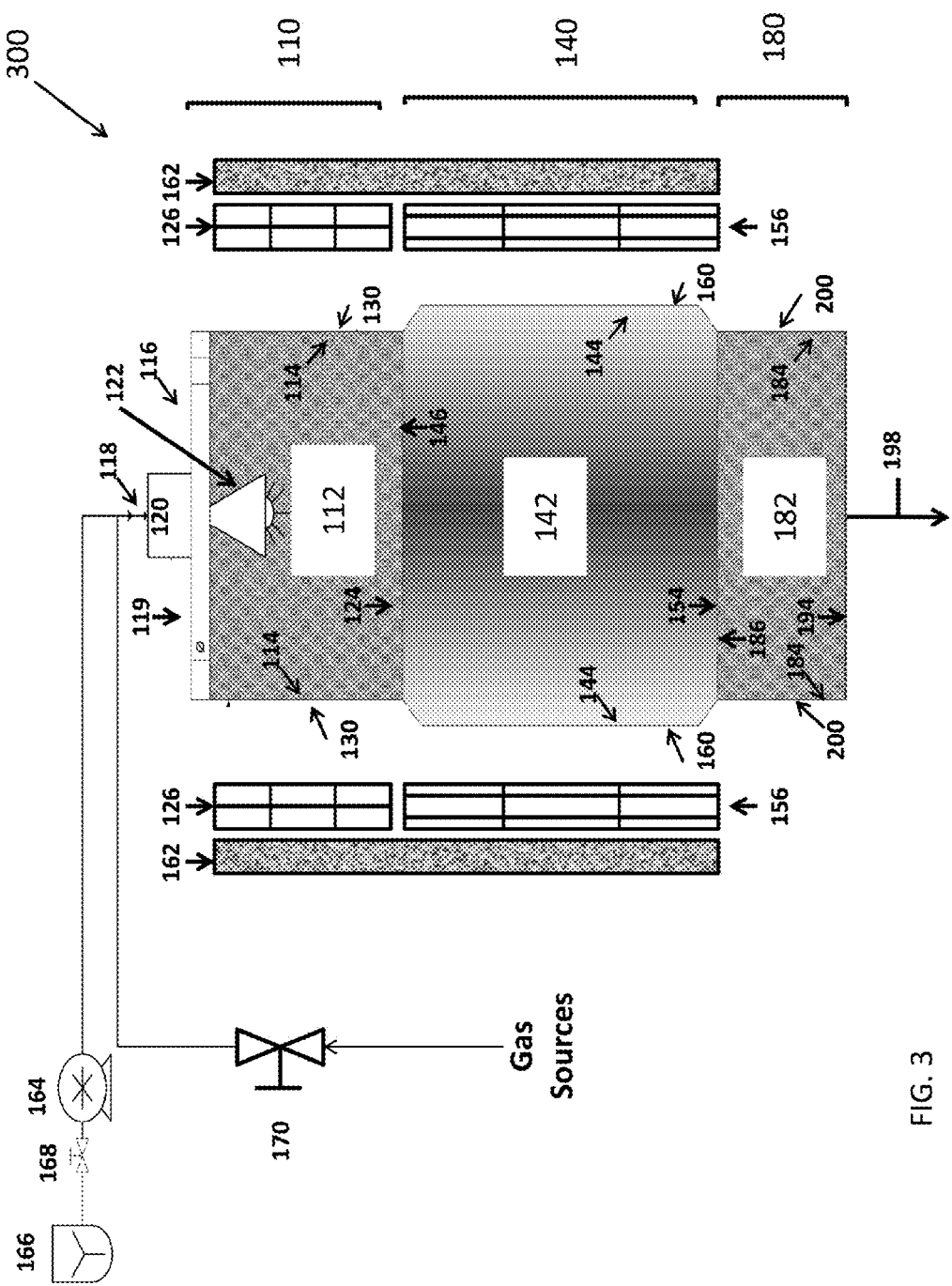
FIG. 3 illustrates, in correspondence with another embodiment of the present disclosure, another exemplary vertical chemical vapor deposition reactor 300, preferably used for synthesizing metal oxide impregnated carbon nanotubes.

After a CVD reaction taking place in the second enclosed chamber 142 of the reaction zone portion 140 is complete, to lower the temperature of the second enclosed chamber 142 quickly so that the CVD reaction product can be expeditiously collected from the inside wall 144 of the second enclosed chamber 142, in a preferred embodiment shown in FIG. 3, the CVD reactor 300 further comprises a cooling zone portion 180 in addition to the preheating zone portion 110 and the reaction zone portion 140. In this embodiment, the cooling zone portion 180 comprises a third enclosed chamber 182 and has a top 186 connected to and in fluid communication with the bottom 154 of the reaction zone portion 140, a bottom 194, and sides with a wall, i.e. inside wall 184, defining the third enclosed chamber 182. The third enclosed chamber 182 of the cooling zone portion 180 is preferably tube-shaped or cylindrically shaped. Like the inside wall 114 of the first enclosed chamber 112 and the inside wall 144 of the second enclosed chamber 142, the inside wall 184 of the third enclosed chamber 182 is preferably made of a material that is substantially gas-impermeable and resistant to a high temperature, such as quartz and stainless steel. With the addition of the cooling zone portion 180, the outlet 198 of the CVD reactor 300 is preferably positioned on the bottom 194 of the cooling zone portion 180 instead of the bottom 154 of the reaction zone portion 140 to extract any excess input gases and vaporized liquid reactant solution(s) and gaseous CVD reaction waste products from the CVD reactor 300, optionally with the help of an evacuation gas supplied to the CVD reactor 300 via the second inlet 119 on the top of the preheating zone portion 110 as described above. The cooling effect provided by the cooling zone portion 180 may be achieved by, for example, circulating cool air or water, or a cool refrigerant in a network of tubing attached to the outside wall 200 and/or inside wall 184 of the third enclosed chamber 182, by pumping cool air into the third enclosed chamber 182, or by placing the cooling zone portion 180 in a low temperature environment, such as a refrigerator and a cool water or ice/water bath. A product collector (not shown in FIG. 3) may be (detachably) attached to the bottom 194 of the cooling zone portion 180 to collect the CVD reaction product separated from the inside wall 144 of the second enclosed chamber 142 of the reaction zone portion 140. In this preferred embodiment, the first inlet 118 for introducing the input (carrier, support, and/or reactant) gases and the liquid reactant solution(s) into the first enclosed chamber 112 of the preheating zone portion 110 may be operatively connected to the pump 164 that is connected to the liquid reactant solution container or mixer 166, and the ultrasonic atomizing nozzle 120 and the height of the preheating zone portion 110 are configured to enable droplets of the liquid reactant solution(s) sprayed from the ultrasonic atomizing nozzle 120 to have a substantially uniform velocity prior to entering the reaction zone portion 140 as described above.

In another embodiment, the disclosed CVD reactor may be horizontal, i.e. the preheating zone portion, the reaction zone portion, and the cooling zone portion if included, are horizontally positioned and horizontally connected to each other.

A second aspect of the disclosure relates to a method of synthesizing carbon nanotubes impregnated with at least one metal oxide, preferably by using the chemical vapor deposition reactor described in the first aspect of the present disclosure. The method includes (a) subjecting a liquid reactant solution to atomization in the presence of at least one gas flow comprising at least one carrier gas and at least one support gas, wherein the liquid reactant solution comprises at least one organic solvent, at least one metallocene, and at least one metal alkoxide, to form an atomized mixture comprising droplets of the liquid reactant solution and the at least one gas flow, and (b) heating the atomized mixture to a temperature of 200° C.-1400° C., wherein the heating forms at least one metal oxide and at least one carbon source compound, wherein the at least one metallocene catalyzes the formation of carbon nanotubes from the at least one carbon source compound and the at least one metal oxide is incorporated into or on a surface of the carbon nanotubes to form the carbon nanotubes impregnated with the at least one metal oxide.

In one embodiment, the disclosed method results in the synthesis of single-walled carbon nanotubes impregnated with at least one metal oxide.

In another embodiment, the disclosed method results in the synthesis of multi-walled carbon nanotubes impregnated with at least one metal oxide. In some embodiments, the multi-walled carbon nanotubes may have a structure conforming to the Russian Doll model, i.e. they contain sheets of graphite arranged in concentric cylinders. In other embodiments, the multi-walled carbon nanotubes have a structure conforming to the Parchment model, i.e. they contain a single sheet of graphite rolled in around themselves and resemble a scroll of parchment.

The liquid reactant solution may be atomized to form a fine spray in a variety of ways, including, but not limited to, electrostatics processes, centrifugal forces, and preferably ultrasonic atomization. Ultrasonic atomization occurs when a liquid film is placed on a smooth surface that is set into vibrating motion such that the direction of vibration is perpendicular to the surface. The liquid absorbs some of the vibrational energy, which is transformed into standing waves. These waves, known as capillary waves, form a rectangular grid pattern in the liquid on the surface with regularly alternating crests and troughs extending in both directions. When the amplitude of the underlying vibration is increased, the amplitude of the waves increases correspondingly; that is, the crests become taller and troughs deeper. A critical amplitude is ultimately reached at which the height of the capillary waves exceeds that required to maintain their stability. The result is that the waves collapse and tiny droplets of liquid are ejected from the tops of the degenerating waves normal to the atomizing surface.

In one embodiment, the ultrasonic atomization of the liquid reactant solution is achieved by feeding the liquid reactant solution to an ultrasonic atomizing nozzle that uses high frequency sound waves produced by piezoelectric transducers acting upon the nozzle tip that will create capillary waves in a liquid film. Once the amplitude of the capillary waves reach a critical height (due to the power level supplied by the generator of the ultrasonic atomizing nozzle), they become too tall to support themselves and tiny droplets fall off the tip of each wave resulting in atomization. The size of the droplets is primarily determined by the frequency of vibration (i.e. the higher the frequency, the smaller the droplet size), and the surface tension and viscosity of the liquid reactant solution. In some embodiments, the frequency of vibration for the ultrasonic atomization of the liquid reactant solution is 10-200 kHz, 15-180 kHz, 20-150 kHz, 20-120 kHz, 20-100 kHz, 40-80 kHz, or 50-70 kHz. In some embodiments, the median droplet size or diameter of the liquid reactant solution that has been subjected to the ultrasonic atomization is about 10-140 microns, about 30-120 microns, about 50-100 microns, or about 70-90 microns. Subjecting the liquid reactant solution to atomization, preferably ultrasonic atomization, or preferably in the chemical vapor deposition reactor described in the first aspect of the present disclosure, advantageously results in the formation of small and uniform liquid reactant solution droplets that promotes the formation of the metal oxide impregnated carbon nanotubes with substantially uniform physical and chemical characteristics, such as the length and diameter of the carbon nanotubes, the weight percentage of the metal oxide relative to the total weight of the metal oxide impregnated carbon nanotubes, and the distribution of the metal oxide particles on the surface of the carbon nanotubes.

An ultrasonic atomizing nozzle ordinarily delivers a soft, low-velocity, and narrow spray. The disclosed method advantageously includes the presence of at least one gas flow comprising at least one carrier gas and at least one support gas during the (ultrasonic) atomization of the liquid reactant solution to shear the spray to a desired width and propel the spray in a desired direction, for example, in a uniform wedge-shaped pattern shown in FIG. 2, producing a wide uniform spray pattern. In some embodiments, the flow rate of the at least one carrier gas may be 500-2000 sccm, 700-1800 sccm, preferably 900-1600 sccm, or more preferably 1000-1500 sccm, and the flow rate of the at least one support gas may be 1500-6000 sccm, 2000-5500 sccm, 2500-5000 sccm, or preferably 3000-4500 sccm. In some embodiments, the combined gas flow rate is between 1 mL/min and 10 L/min, between 10 mL/min and 5 L/min, between 50 mL/min and 1 L/min, between 100 mL/min and 750 mL/min, between 150 mL/min and 500 mL/min, or between 200 mL/min and 250 mL/min. In some embodiments, the uniform spray pattern resulting from the ultrasonic atomization of the liquid reactant solution in the presence of the at least one gas flow may be 2-20 inches wide, or 5-18 inches wide, or 8-16 inches wide.

In some embodiments, the at least one carrier gas is preferably an inert gas selected from the group consisting of He, $N_2$, and Ar.

In some embodiments, the at least one support gas comprises a gas that is slightly oxidative to remove amorphous carbon, such as $CO_2$ and $H_2O$, and/or preferably a reducing gas such as $H_2$ and $NH_3$.

The liquid reactant solution comprises at least one organic solvent, non-limiting examples of which include 2-methoxy ethanol, 2-ethoxy ethanol, 2-methoxy propanol, 2-ethoxy propanol, 2-propoxy propanol, 2-butoxy propanol, 2-butoxy butanol, and liquid hydrocarbons, such as cyclohexane, heptane, octane, benzene, toluene, ethyl benzene, xylene, cumene, and styrene. In the disclosed method, the organic solvent can also act as a carbon source compound and/or produce one or more carbon source compounds for the formation of carbon nanotubes during the heating.

Additionally, the liquid reactant solution comprises at least one metal alkoxide. Depending on the metal oxide(s) desired to be incorporated into or on the surface of the carbon nanotubes, non-limiting examples of suitable metal alkoxides include an aluminum alkoxide, a titanium alkoxide, a magnesium alkoxide, a calcium alkoxide, a strontium alkoxide, a barium alkoxide, a scandium alkoxide, a yttrium alkoxide, a zirconium alkoxide, a lanthanum alkoxide, a vanadium alkoxide, and a silicon alkoxide. Preferred metal alkoxides include metal ethoxides, metal propoxides, metal isopropoxides, metal butoxides, metal isobutoxides, and metal tert-butoxides. In a preferred embodiment, the at least one metal alkoxide is one or more metal alkoxy alkoxides that are generally highly soluble in an organic solvent, e.g. having a solubility of at least 15 weight percent at ambient temperature (approximately 20° C.) in toluene, or 2-methoxy ethanol, or 2-butoxy butanol. Non-limiting examples of preferred metal alkoxy alkoxides include (Z—$(CH_2)_n$—O)—Mg—(O—$(CH_2)_m$—$OR_2$), (Z—$(CH_2)_n$—O)—Ca—(O—$(CH_2)_m$—$OR_2$), (Z—$(CH_2)_n$—O)-M2-(O—$(CH_2)_m$—$OR_2$), and $$\begin{array}{c}(Z\text{—}(CH_2)_n\text{—}O)\text{—}M3\text{—}(O\text{—}(CH_2)_m\text{—}OR_2)\\ |\\ (O\text{—}(CH_2)_p\text{—}Z)\end{array}$$

wherein M2 is a Group IIA metal selected from strontium or barium; M3 is a Group IIIA metal selected from scandium, yttrium or lanthanum; m, n and p are the same or different positive integers from 1 to 12; Z is $(R_1O)$— or $(R_1)$—, and $R_1$ and $R_2$ are the same or different hydrocarbyl radicals of from 1 to 20 carbon atoms. Particularly preferred $R_1$ groups are those with one to four carbon atoms, such as methyl, ethyl, propyl, and butyl.

In some embodiments, more than one metal alkoxide is included in the liquid reactant solution to synthesize carbon nanotubes impregnated with more than one metal oxide produced from the more than one metal alkoxide.

Metallocenes are a type of sandwich compound, an organometallic complex featuring a metal bound by haptic covalent bonds to two arene ligands. A metallocene is a compound typically consisting of two substituted or unsubstituted cyclopentadienyl anions (Cp, which is $C_5H_5^-$) bound to a metal center (M) in the oxidation state II or IV, with the resulting general formula $(C_5H_5)_2M$ or $(C_5H_5)_2MX_2$, e.g., titanocene dichloride, vanadocene dichloride. There are other metallocenes that have bent or tilted Cp rings with additional ligands (L) with the general formula of $(\eta\text{-}C_5H_5)_2ML_x$ and that have only one Cp ligand with additional ligands (L) with the general formula of $(\eta\text{-}C_5H_5)ML_x$. The liquid reactant solution further comprises at least one metallocene, preferably a metallocene of Ni, a metallocene of Co, a metallocene of Fe, a metallocene of Cr, a metallocene of Mo, a metallocene of Rh, a metallocene of Ti, a metallocene of W, a metallocene of V, and a metallocene of Zr.

When heated to a temperature of 200-1400° C., 400-1200° C., preferably 500-1000° C., preferably 600-900° C., more preferably 750-900° C., or more preferably 850° C., according to the disclosed method, the metal alkoxide in the liquid reactant solution droplets of the atomized mixture forms a metal oxide and/or one or more carbon source compounds, e.g. an alkene, for the formation of carbon nanotubes (e.g. the carbon source compound is further catalytically cracked on the surface of a metal particle catalyst produced from the metallocene described below to generate carbon atoms), and the metallocene in the liquid reactant solution droplets of the atomized mixture forms metal particles, preferably the metal particles of Ni, Co, Fe, Cr, Mo, Rh, Ti, W, V, and Zr, that catalyze the formation of carbon nanotubes (e.g. following the contacting of the carbon source compound (gas) with the metal particle catalyst, the carbon generated from the cracking of the carbon source compound is dissolved into the metal particles, and after oversaturation of the carbon in the metal particles, continuous growth of the carbon nanotubes from the metal particles takes place in the presence of a stable carbon source compound (gas) supply to the metal particles), and still additional one or more carbon source compounds (e.g. $CH_4$ and $C_5H_6$) for the formation of single-walled or multi-walled carbon nanotubes, as disclosed by Clarence S. Yah, Geoffrey S. Simate, Kapil Moothi, Kwena S. Maphutha, and Sunny E. Iyuke, Synthesis of Large Carbon Nanotubes from Ferrocene: The Chemical Vapour Deposition Technique, Trends in Applied Sciences Research 6 (11): 1270-1279, 2011; Amelia Barreiro, Silke Hampel, Mark H. Rümmeli, Christian Kramberger, Alexander Grneis, Kati Biedermann, Albrecht Leonhardt, Thomas Gemming, Bernd Büchner, Adrian Bachtold, and Thomas Pichler, Thermal Decomposition of Ferrocene as a Method for Production of Single-Walled Carbon Nanotubes without Additional Carbon Sources, J. Phys. Chem. B, 2006, 110 (42), pp 20973-20977; each incorporated herein by reference in their entirety.

In some embodiments, the heating is performed at a heating rate of 0.01-50° C./min, 0.05-45° C./min, 0.1-40° C./min, 0.5-30° C./min, 1-20° C./min, or 5-10° C./min. In some embodiments, the duration of the heating is 1-1200 min, 5-1000 min, 10-900 min, 30-800 min, 50-700 min, 100-600 min, 150-500 min, or 200-400 min. With the heating of the liquid reactant solution droplets taking place in the presence of the gas flow of the carrier gas and the support gas, the vaporized liquid reactant solution droplets are mixed with the gas flow to form the metal oxide impregnated carbon nanotubes. When the disclosed method is implemented in a chemical vapor deposition reactor, preferably in the chemical vapor deposition reactor according to the first aspect of the present disclosure, the gas flow advantageously maximize the dispersion of the vaporized organic solvent(s), metallocene(s) and metal alkoxide(s), and their reaction products throughout the reaction zone of the chemical vapor deposition reactor, thus effectively utilizing the full capacity of the chemical vapor deposition reactor to maximize the synthesis of the metal oxide impregnated carbon nanotubes, facilitating an efficient contact of the gaseous carbon source compounds (e.g. alkenes, $CH_4$, and $C_5H_6$) with the catalyst (i.e. the metal particles), reducing agglomeration of the carbon nanotubes and/or the metal oxide particles incorporated into or on the surface of the carbon nanotubes, and promoting homogeneous physical and chemical characteristics of the metal oxide impregnated carbon nanotubes.

The concentration of the at least one metal alkoxide in the liquid reactant solution may be 0.1-50%, 0.5-45%, 1-40%, 5-35%, 10-30%, or 15-20% of the total weight of the liquid reactant solution. The concentration of the at least one metallocene in the liquid reactant solution may be 0.1-50%, 0.5-45%, 1-40%, 5-35%, 10-30%, or 15-20% of the total weight of the liquid reactant solution. The weight ratio of the at least one metal alkoxide to the at least one metallocene in the liquid reactant solution may be from 10:1 to 1:10, from 8:1 to 1:8, from 5:1 to 1:5, from 3:1 to 1:3, from 2:1 to 1:2, or 1:1. By varying the total amount of the liquid reactant solution, the concentrations of the metal alkoxide(s) and the metallocene(s) in the liquid reactant solution, and the weight ratio of the metal alkoxide(s) to the metallocene(s), the reaction temperature, pressure, and time, the amount of the support gas, e.g. hydrogen gas, that prevents or limits deactivation of the catalyst, etc, in some embodiments, the carbon nanotubes synthesized by the disclosed method comprise the metal particle catalyst encapsulated inside the carbon nanotubes, have a length of 50 nm-100 µm, 75 nm-50 µm, 100 nm-25 µm, 150 nm-10 µm, 200 nm-5 µm, 300 nm-1 µm, 400 nm-900 nm, 500 nm-800 nm, 600 nm-700 nm, or greater than 0.1 mm, greater than 0.5 mm, greater than 1 mm, greater than 5 mm, or greater than 1 cm; have an average outer diameter of about 1-100 nm, about 5-90 nm, about 10-70 nm, about 20-50 nm, about 30-40 nm; and have about 5-90%, about 10-80%, about 20-60%, about 30-50% of their surfaces covered by the metal oxide particles.

In one embodiment, the metal oxide particles form a layer covering an exterior surface and/or an interior surface of the carbon nanotubes. In another embodiment, the metal oxide particles are sandwiched between surfaces of the carbon nanotubes.

In another embodiment, the metal oxide particles are incorporated into the carbon nanotubes. For example, the metal oxide particles are mixed with and/or integrated into the carbon nanotubes, and/or embedded within or among graphite sheets of the carbon nanotubes, and/or completely or partially embedded within a surface of the carbon nanotubes.

In some embodiments, the average particle size or diameter of the metal oxide particles incorporated into or on the surface of the carbon nanotubes may be about 1-200 nm, about 1-180 nm, about 5-150 nm, about 5-100 nm, about 10-80 µm, about 15-60 nm, or about 20-40 nm.

In one embodiment, the metal oxide particles are aluminum oxide particles which are produced from an aluminum alkoxide (e.g. aluminum isopropoxide) and which may have various crystalline phases. In one embodiment, the aluminum oxide particles comprise $\alpha$-$Al_2O$, (i.e. aluminum oxide in corundum crystalline phase). In another embodiment, the aluminum oxide particles comprise $\gamma$-$Al_2O_3$. In another embodiment, the aluminum oxide particles comprise $\eta$-$Al_2O_3$. In another embodiment, the aluminum oxide particles comprise $\theta$-$Al_2O_3$. In another embodiment, the aluminum oxide particles comprise $\chi$-$Al_2O_3$. In another embodiment, the aluminum oxide particles comprise $\kappa$-$Al_2O_3$. In still another embodiment, the aluminum oxide particles comprise $\delta$-$Al_2O_3$.

In some embodiments, to supply still more carbon source compounds for the formation of carbon nanotubes, the at least one gas flow and/or the liquid reactant solution may further comprise one or more additional carbon-containing compounds selected from, without limitation, ethylene, pentene, cyclopentadiene, methane, ethane, propane, butane, butadiene, pentane, hexane, cyclohexane, carbon monoxide, carbon dioxide, benzene, xylene, and toluene.

The disclosed method may be carried out under an atmospheric pressure, a low pressure, or a vacuum. If the method is carried out under an atmospheric pressure, helium (He) may be preferably used as a carrier gas, so that it is possible to minimize damage to the carbon nanotubes caused by collisions against heavy argon (Ar) at high temperatures. If the method is carried out under a low pressure or a vacuum, hydrogen ($H_2$) may be preferably used as a support gas to deoxidize an oxidized surface of the metal particle catalyst at a high temperature, so that high-quality carbon nanotubes can be formed.

In one embodiment, the at least one metal alkoxide in the liquid reactant solution is aluminum isopropoxide, which forms aluminum oxide when the atomized mixture comprising the droplets of the liquid reactant solution and the at least one gas flow is heated. In some embodiments, the resulting product is multi-walled carbon nanotubes impregnated with aluminum oxide which have a BET surface area of 450-2000 m$^2$/g, 600-1900 m$^2$/g, 700-1800 m$^2$/g, 800-1700 m$^2$/g, 900-1600 m$^2$/g, 1000-1500 m$^2$/g, or 1100-1300 m$^2$/g. In some embodiments, the resulting product is single-walled or multi-walled carbon nanotubes impregnated with aluminum oxide that comprise Al in an amount of 5-20%, 5-15%, or 10-15% of the total weight of the single-walled or multi-walled carbon nanotubes impregnated with the aluminum oxide. In some embodiments, the resulting product is single-walled or multi-walled carbon nanotubes impregnated with aluminum oxide, with 1-99 wt %, 5-90 wt %, 10-80 wt %, 20-70 wt %, 30-60 wt %, or 40-50 wt % of the aluminum oxide particles incorporated into or on the surface of the carbon nanotubes being in corundum phase.

In one embodiment, the method further comprises collecting the carbon nanotubes impregnated with the at least one metal oxide. For example, when the disclosed method is implemented with a CVD reactor, such as the one described in the first aspect of the disclosure, the metal oxide impregnated carbon nanotubes may be attached to the wall of the reaction zone of the CVD reactor. In order to collect them, the metal oxide impregnated carbon nanotubes have to be separated from the wall by scraping, brushing, or other means.

Although particular embodiments have been shown and described, it will be understood that they are not intended to limit the present inventions, and it will be obvious to those skilled in the art that various changes and modifications may be made without departing from the spirit and scope of the present inventions. The specification and drawings are, accordingly, to be regarded in an illustrative rather than restrictive sense. The present disclosure is intended to cover alternatives, modifications, and equivalents, which may be included within the spirit and scope of the present inventions as defined by the claims.

Having generally described this invention, a further understanding can be obtained by reference to certain specific examples which are provided herein for purposes of illustration only and are not intended to be limiting unless otherwise specified.

EXAMPLE 1

Materials and Methods

1. Materials p-Xylene (C$_8$H$_{10}$, 96-99%), ferrocene ((C$_5$H$_5$)$_2$Fe, 96-99%), and aluminum isopropoxide (C$_9$H$_{21}$AlO$_3$, 98-99%) were purchased from Sigma-Aldrich Co. LLC., Honeywell Riedel-de Haen International Inc., and Acros Organics, USA, respectively, and were used without further treatment. A wide range ultrasonic atomizing nozzle with an operating frequency of 20 kHz was bought from Sonaer Inc., USA.

Figure 4:
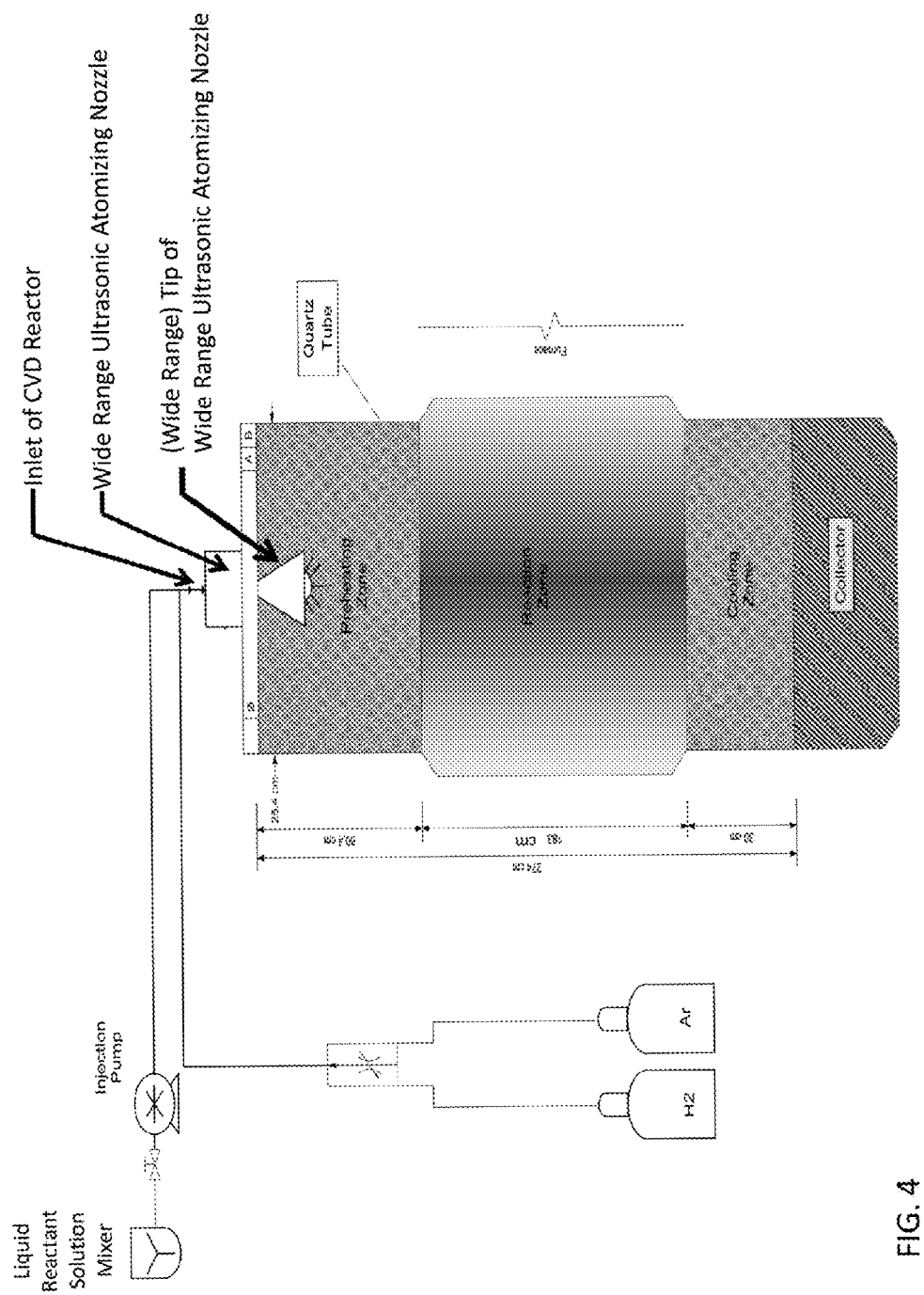
FIG. 4 illustrates a vertical chemical vapor deposition reactor used to synthesize aluminum oxide impregnated multi-walled carbon nanotubes according to Example 1.

2. Method of Synthesizing Aluminum Oxide Impregnated Multi-Walled Carbon Nanotubes FIG. 4 shows the vertical chemical vapor deposition (CVD) reactor used to synthesize aluminum oxide impregnated multi-walled carbon nanotubes. An electric furnace placed about the reaction zone of the reactor was used to raise the temperature of the reaction zone to a desired reaction temperature of 750-900° C. Argon gas was used as a carrier gas and hydrogen gas was used as a support gas. Both gases, as well as a liquid reactant solution, were introduced into the preheating zone of the reactor through an inlet, which was operatively connected to the wide range ultrasonic atomizing nozzle, on the top of the preheating zone of the reactor. The liquid reactant solution comprising 1 wt % ferrocene, 1 wt % aluminum isopropoxide (AIPO), and 98 wt % p-xylene was prepared in a liquid reactant solution mixer connected to an injection (or syringe) pump via a valve. With the injection pump connected to the inlet of the reactor, the liquid reactant solution was injected into the inlet at a flow rate of 90 mL/h and atomized by the wide range ultrasonic atomizing nozzle connected to the inlet of the reactor to result in an even distribution of the liquid reactant solution inside the reactor as shown in FIG. 2.

The ratio of the carrier gas to the support gas may be varied depending on specific reaction conditions (e.g. the amount of additional hydrogen gas produced from the vaporized liquid reactant solution during the CVD reaction) and the desired characteristics of the reaction product, such as the length and diameter of the carbon nanotubes that are in part affected by the catalyst activity protected by the hydrogen gas as a reductant. After passing through the reactor, the excess carrier and support gases and the vaporized liquid reactant solution, and gaseous reaction waste products exit the reactor via an outlet at the bottom of the cooling zone.

The CVD reaction temperature of the reactor was set to 750-900° C., preferably 850° C. At this high temperature, AIPO was cracked to produce Al$_2$O$_3$ according to the following chemical reaction:

$$Al(OCH(CH_3)_2)_3 \rightarrow 0.5Al_2O_3 + 3C_3H_6 + 1.5H_2O$$

With ferrocene as the catalyst, C$_3$H$_6$ and other carbon source compounds supplied from p-xylene and ferrocene led to the formation of multi-walled carbon nanotubes. The in-situ synthesized alumina particles were incorporated into or on a surface of the multi-walled carbon nanotubes to form aluminum oxide impregnated multi-walled carbon nanotubes. The flow rates of the hydrogen and argon gases were set to 3000 and 1000 sccm, respectively. Deposition of carbon nanotubes on the quartz wall of the reactor was observed. Following the completion of the injection of the liquid reactant solution, the hydrogen gas flow and the electric furnace were turned off to allow the reactor to cool down to room temperature in an argon atmosphere. The aluminum oxide impregnated multi-walled carbon nanotubes were separated from the wall of the reactor with a scraper or a brush and collected in the collector at the bottom of the reactor.

EXAMPLE 2

Characterization of the Synthesized Aluminum Oxide Impregnated Multi-Walled Carbon Nanotubes The synthesized aluminum oxide impregnated multi-walled carbon nanotubes were characterized and compared with pure multi-walled carbon nanotubes by using scanning electron microscopy (SEM, TESCAN MIRA 3 FEG-SEM), transmission electron microscopy (TEM, field emission electron microscope JEM-2100F), energy-dispersive X-ray spectroscopy (EDS), the Brunauer-Emmett-Teller (BET) method to determine the surface areas (Quantachrome, Autosorb IQM0000-4), and X-ray diffraction (XRD) (Desktop X-ray Diffractometer, Miniflex II).

Figure 5:
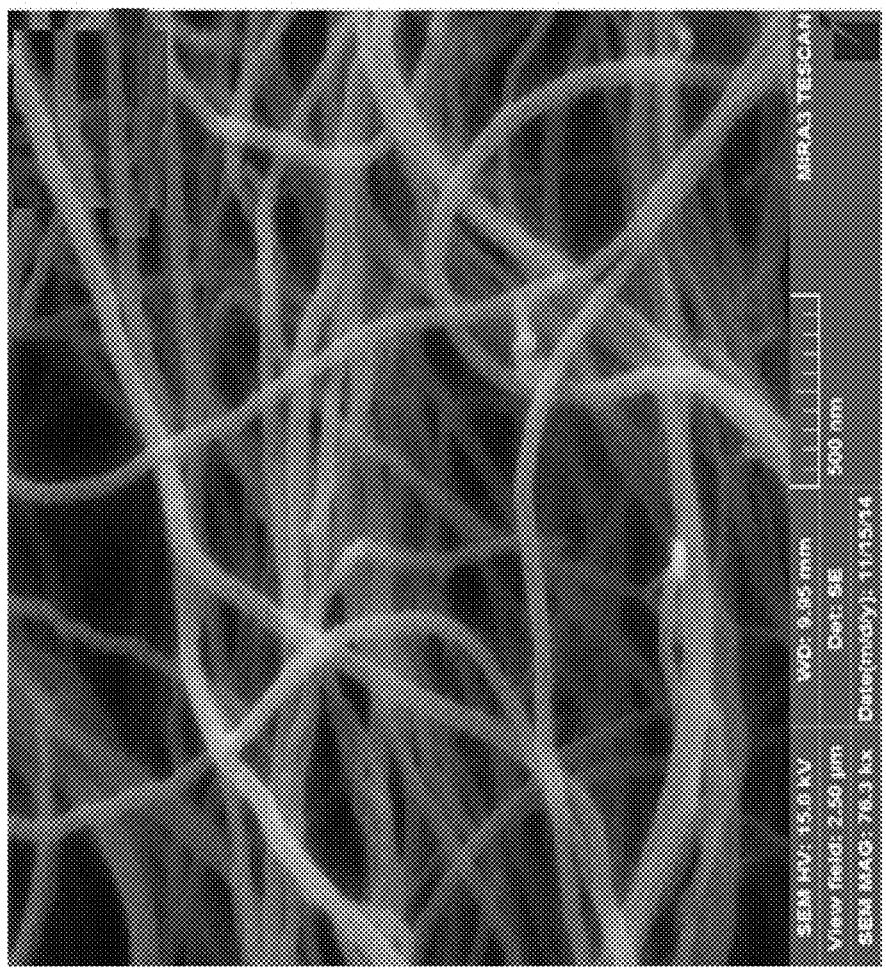
FIG. 5 is an SEM image of the pure multi-walled carbon nanotubes according to Example 2.
Figure 6:
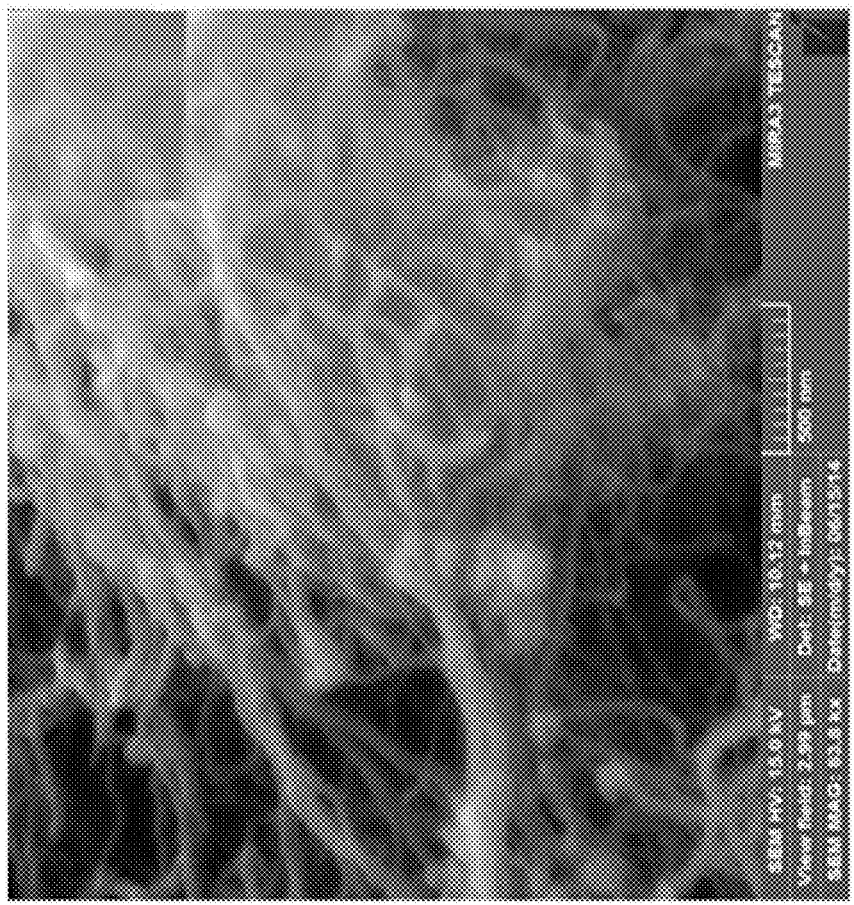
FIG. 6 is an SEM image of the aluminum oxide impregnated multi-walled carbon nanotubes according to Example 2.
Figure 7:
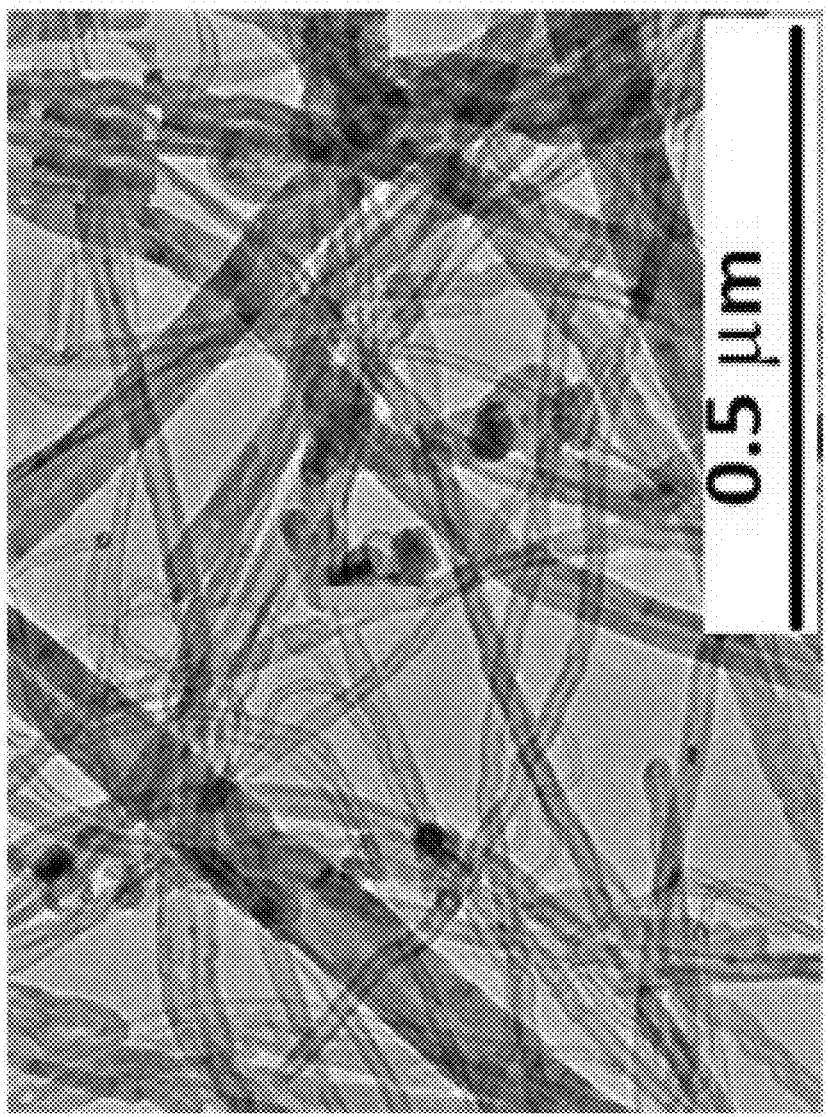
FIG. 7 is a TEM image of the pure multi-walled carbon nanotubes according to Example 2.
Figure 9A:
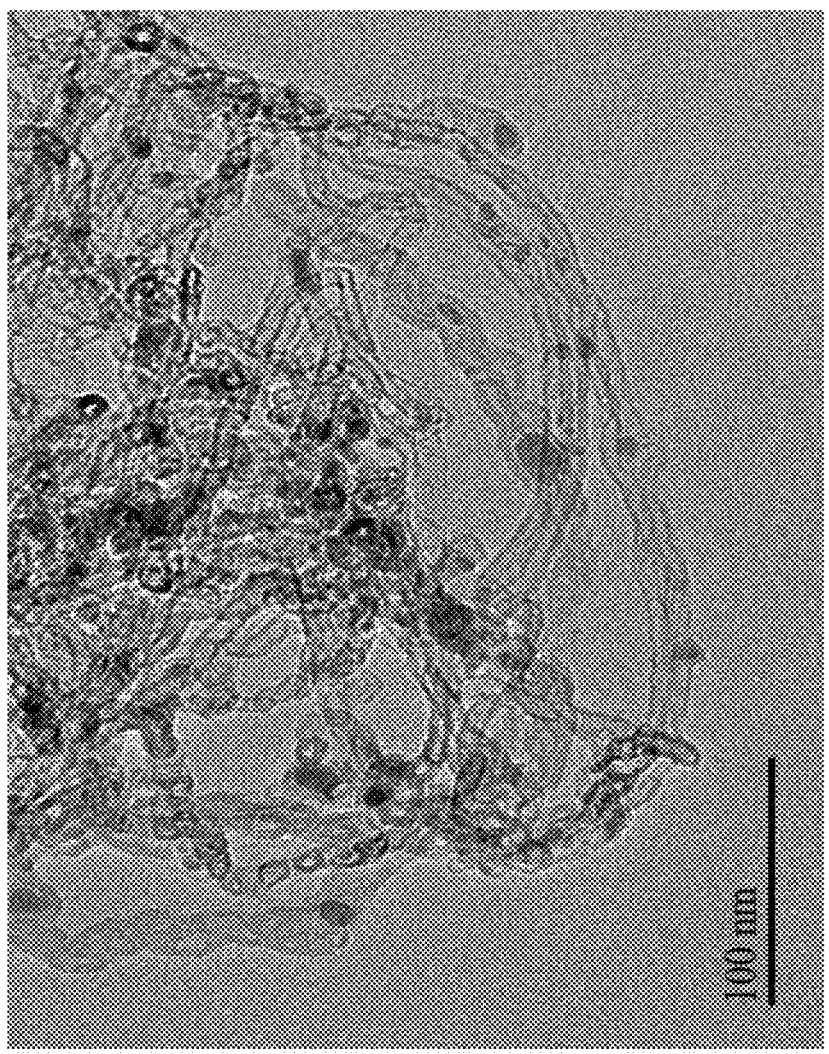
FIG. 9A is a graphical presentation showing the area of the aluminum oxide impregnated multi-walled carbon nanotube sample selected for the EDS analysis according to Example 2.
Figure 9B:
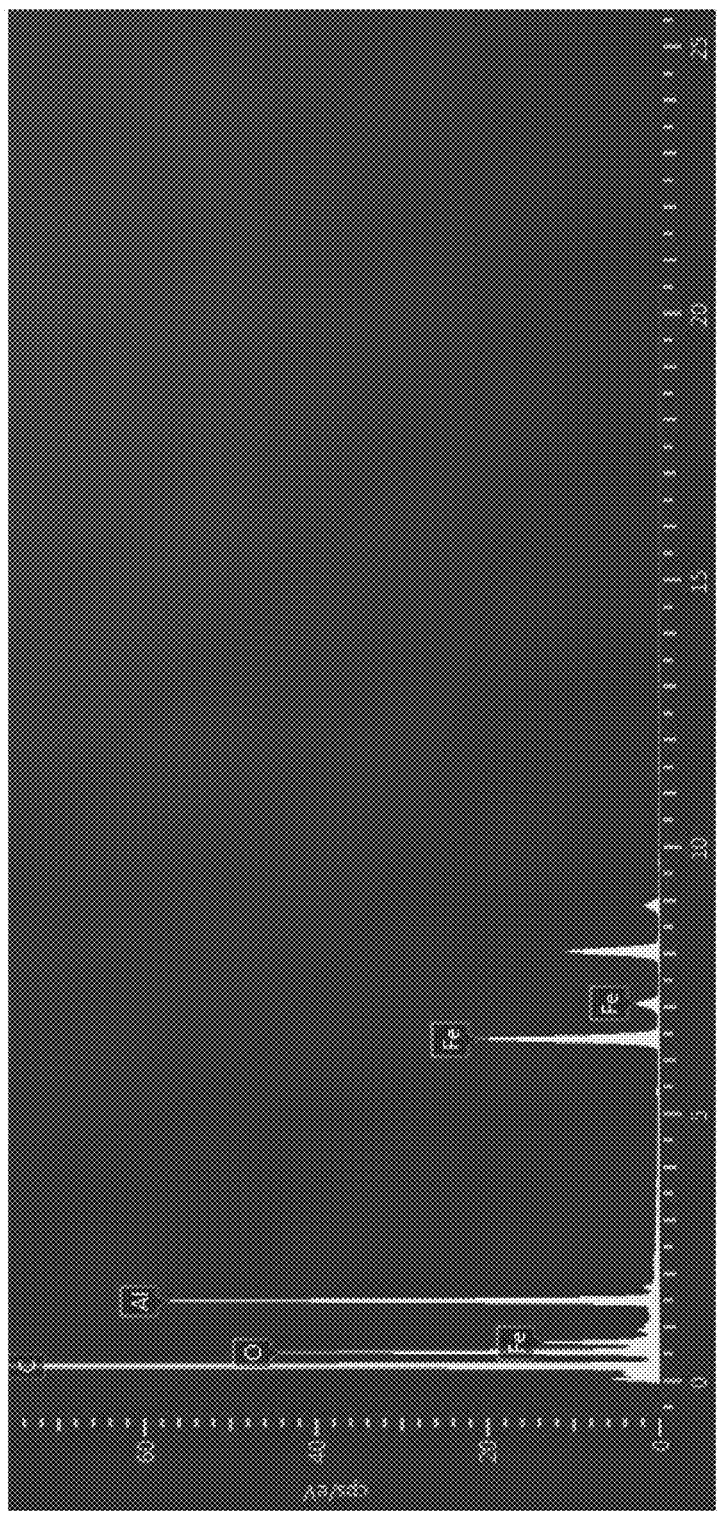
FIG. 9B is a graphical presentation of the EDS spectrum from the EDS analysis of the selected area of the aluminum oxide impregnated multi-walled carbon nanotube sample shown in FIG. 9A according to Example 2.

Dispersion of $Al_2O_3$ on the surface of the multi-walled carbon nanotubes could be varied by changing the reaction parameters that affected the impregnation process. Comparing FIG. 6, which is an SEM image of the aluminum oxide impregnated multi-walled carbon nanotubes, with FIG. 5, which is an SEM image of pure multi-walled carbon nanotubes, the aluminum oxide impregnated multi-walled carbon nanotubes had cloudy particles present on the surface of the multi-walled carbon nanotubes. Comparing FIG. 8, which is a TEM image of the aluminum oxide impregnated multi-walled carbon nanotubes with the arrows pointing to the cloudy particles covering the surface of the multi-walled carbon nanotubes, with FIG. 7, which is a TEM image of the pure multi-walled carbon nanotubes, the TEM analysis showed in greater detail the structure of the aluminum oxide impregnated multi-walled carbon nanotubes and the pure multi-walled carbon nanotubes EDS measurement was used to determine the exact atomic weight percent of the elements present in the aluminum oxide impregnated multi-walled carbon nanotubes, with the results presented in FIG. 9A and FIG. 9B. The building block of carbon nanotubes, carbon was present at about 67.8% of the total weight of the aluminum oxide impregnated multi-walled carbon nanotubes. The catalyst for the growth of the multi-walled carbon nanotubes, iron was present at about 8.2% of the total weight of the aluminum oxide impregnated multi-walled carbon nanotubes. Aluminum and oxygen were present at about 11.2% and about 12.9% of the total weight of the aluminum oxide impregnated multi-walled carbon nanotubes, respectively. However, the stoichiometric ratio of aluminum to oxygen was not 2 to 3 as expected in $Al_2O_3$.

Figure 10:
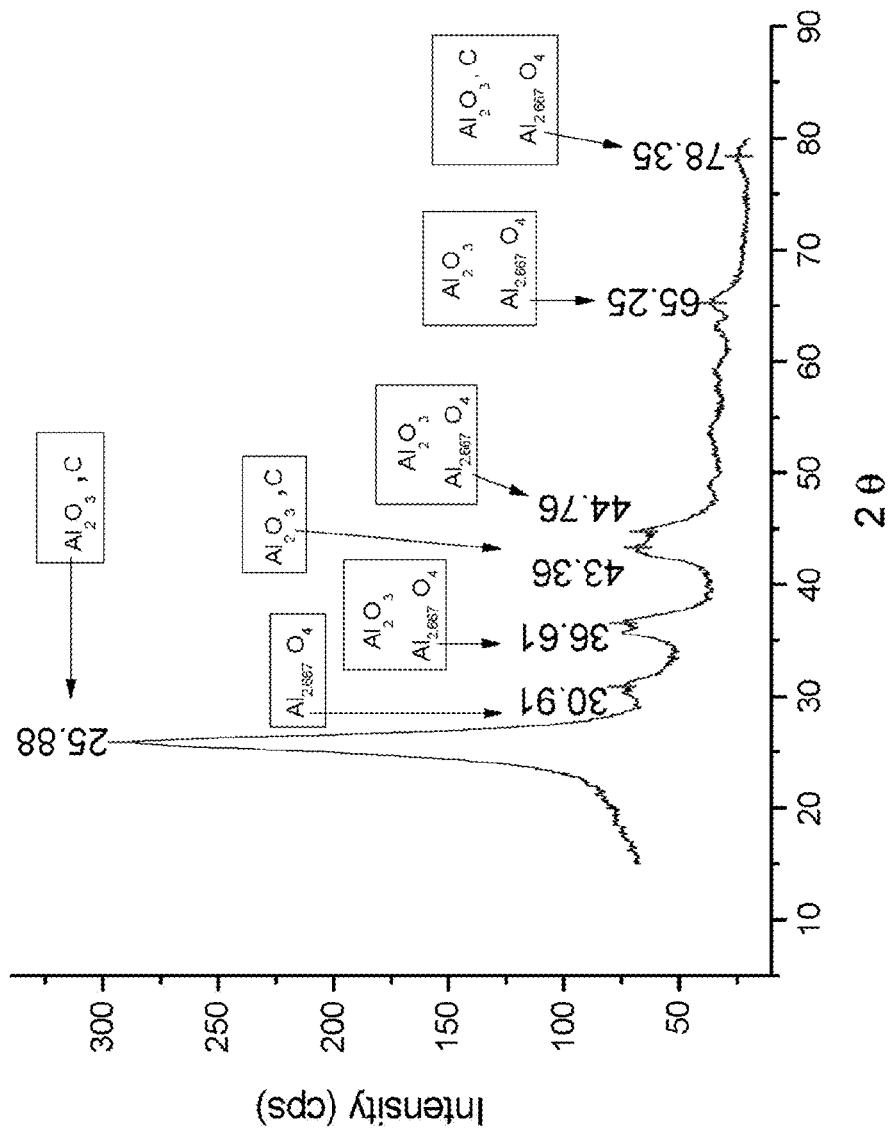
FIG. 10 is a graphical presentation of the XRD analysis result of the aluminum oxide impregnated multi-walled carbon nanotubes according to Example 2.

XRD analysis was used to identify the atomic and molecular structure of aluminum and oxygen present in the synthesized aluminum oxide impregnated multi-walled carbon nanotube sample, with the results presented in FIG. 10. Different peaks were obtained based on regularity and symmetry of the sample. One main peak at $2\theta=25.88$ shows the presence of multi-walled carbon nanotubes. Other low intensity peaks represent the presence of oxides of aluminum. The phase and molecular forms of the elements present in the sample were determined by a built-in peak fitting technique of the XRD instrument. Referring to FIG. 10, aluminum and oxygen were present in the sample at different Al to O ratios. Mostly $Al_2O_3$ in corundum phase was present in the sample, but non-stoichiometric alumina phase $Al_{2.667}O_4$ was also present. The new phase of alumina accounts for the unexpected stoichiometric ratio of aluminum to oxygen obtained from the EDS analysis, and may be the result of a side reaction taking place in the reactor or due to an incomplete crystallization process.

The surface areas of the pure multi-walled carbon nanotubes and the aluminum oxide impregnated multi-walled carbon nanotubes were measured by using BET nitrogen adsorption at a temperature of 77 K. The results showed that the surface area of the pure multi-walled carbon nanotubes was 100 $m^2/g$, whereas that of the aluminum oxide impregnated multi-walled carbon nanotubes was 820 $m^2/g$. The increased surface area of the aluminum oxide impregnated multi-walled carbon nanotubes may result from an even distribution of the aluminum oxide particles on the surface of the multi-walled carbon nanotubes.

The invention claimed is:

1. A method of synthesizing carbon nanotubes impregnated with aluminum oxide, the method comprising:
   (a) subjecting a liquid reactant solution to atomization in the presence of at least one gas flow comprising at least one carrier gas and at least one support gas, wherein the liquid reactant solution comprises at least one organic solvent, at least one metallocene, and aluminum isopropoxide, to form an atomized mixture comprising droplets of the liquid reactant solution and the at least one gas flow, and
   (b) heating the atomized mixture to a temperature of 200° C.-1400° C., wherein the heating forms aluminum oxide and at least one carbon source compound, wherein the at least one metallocene catalyzes the formation of carbon nanotubes from the at least one carbon source compound and the aluminum oxide is incorporated into or on a surface of the carbon nanotubes to form the carbon nanotubes impregnated with the aluminum oxide,
   wherein 1-99 wt % of the aluminum oxide incorporated into or on the surface of the carbon nanotubes is in corundum phase.

2. The method of claim 1, further comprising collecting the carbon nanotubes impregnated with the aluminum oxide.

3. The method of claim 1, wherein the at least one carrier gas is at least one selected from the group consisting of He, $N_2$, and Ar.

4. The method of claim 1, wherein the at least one support gas is selected from the group consisting of $CO_2$, $H_2O$, $H_2$ and $NH_3$.

5. The method of claim 1, wherein the at least one organic solvent is selected from the group consisting of 2-methoxy ethanol, 2-ethoxy ethanol, 2-methoxy propanol, 2-ethoxy propanol, 2-propoxy propanol, 2-butoxy propanol, 2-butoxy butanol, cyclohexane, heptane, octane, benzene, toluene, ethyl benzene, xylene, cumene, and styrene.

6. The method of claim 1, wherein the at least one metallocene is selected from the group consisting of a metallocene of Ni, a metallocene of Co, a metallocene of Fe, a metallocene of Cr, a metallocene of Mo, a metallocene of Rh, a metallocene of Ti, a metallocene of W, a metallocene of V, and a metallocene of Zr.

7. The method of claim 1, wherein the carbon nanotubes are multi-walled carbon nanotubes, and wherein the multi-walled carbon nanotubes impregnated with the aluminum oxide have a BET surface area of 450-2000 $m^2/g$.

8. A method of synthesizing carbon nanotubes impregnated with aluminum oxide, the method comprising:
   (a) subjecting a liquid reactant solution to atomization in the presence of at least one gas flow comprising at least one carrier gas and at least one support gas, wherein the liquid reactant solution comprises at least one organic solvent, at least one metallocene, and aluminum isopropoxide, to form an atomized mixture comprising droplets of the liquid reactant solution and the at least one gas flow, and
   (b) heating the atomized mixture to a temperature of 200° C.-1400° C., wherein the heating forms aluminum oxide and at least one carbon source compound, wherein the at least one metallocene catalyzes the formation of carbon nanotubes from the at least one carbon source compound and the aluminum oxide is incorporated into or on a surface of the carbon nanotubes to form the carbon nanotubes impregnated with the aluminum oxide,
   wherein the carbon nanotubes are multi-walled carbon nanotubes, and wherein the multi-walled carbon nanotubes impregnated with the aluminum oxide have a BET surface area of 450-2000 m²/g.

* * * * *